Figure 1:
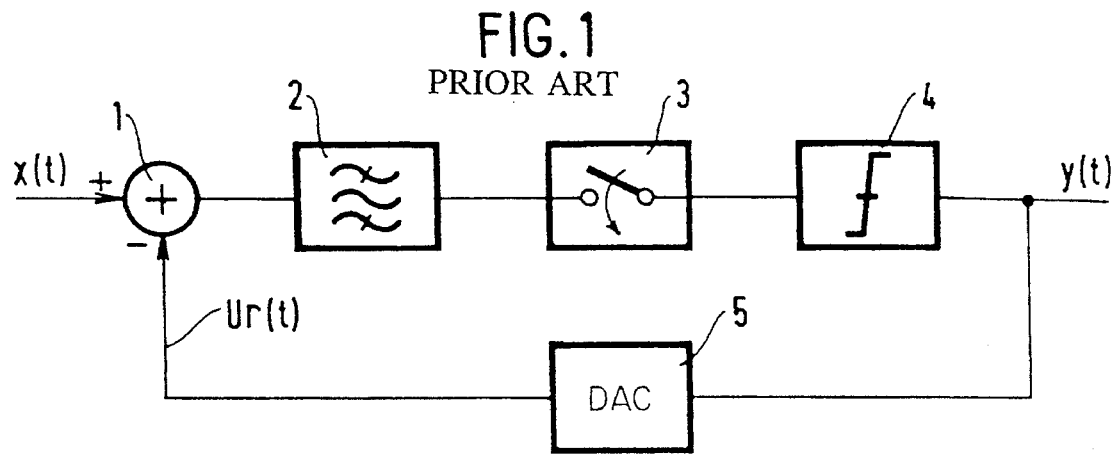

US005565868A

United States Patent [19]
Azrouf et al.

[11] Patent Number: 5,565,868
[45] Date of Patent: Oct. 15, 1996

[54] MODULATED FEEDBACK LOOP ANALOG-TO-DIGITAL CONVERTER

[75] Inventors: Sabrina Azrouf; Maurice Bellanger; Vincent Bruneau; Frédéric Gourgue, all of Paris, France

[73] Assignee: Alcatel Mobile Communication France, Paris, France

[21] Appl. No.: 273,802

[22] Filed: Jul. 12, 1994

[30] Foreign Application Priority Data

Jul. 13, 1993 [FR] France ................... 93 08625

[51] Int. Cl.$^6$ .................................................. H03M 1/12
[52] U.S. Cl. .......................................... 341/155; 341/143
[58] Field of Search ............................ 341/143, 152, 341/155, 157

[56] References Cited

U.S. PATENT DOCUMENTS

| | | | |
|---|---|---|---|
| 4,287,595 | 9/1981 | Meyers | 375/28 |
| 5,039,909 | 8/1991 | Welland et al. | 341/143 |
| 5,257,026 | 10/1993 | Thompson et al. | 341/118 |
| 5,347,279 | 9/1994 | Ishihara et al. | 341/166 |
| 5,351,048 | 9/1994 | Yamasaki | 341/110 |

FOREIGN PATENT DOCUMENTS

0399738A2  11/1990  European Pat. Off. .

OTHER PUBLICATIONS

H.-J. Dressler, "Interpolative Bandpass—A/D Conversion", *Signal Processing, European Journal Devoted to the Methods and Applications of Signal Processing*, vol. 22, No. 2, Feb. 1991.

*Primary Examiner*—Marc S. Hoff
*Attorney, Agent, or Firm*—Sughrue, Mion, Zinn, Macpeak & Seas

[57] ABSTRACT

The analog-to-digital converter receives an analog input signal (x(t)) to produce a digital error signal (y(t)).

It comprises a subtractor (1) to calculate the difference between the input signal and a reference signal (Ur(t)), a converter subsystem (2, 3, 4) to produce the error signal from said difference and a feedback loop to produce the reference signal by means of a digital-to-analog converter (5) which delivers a comparison signal (Uc(t)) in response to the error signal.

In accordance with the invention, the input signal (x(t)) is assigned a center frequency ($f_0$), the feedback loop comprises a displacement unit (7) for displacing the frequency response of the digital-to-analog converter (5) from the null frequency towards the center frequency ($f_0$), said displacement unit producing the reference signal (Ur(t)) from the comparison signal (Uc(t)).

11 Claims, 5 Drawing Sheets

MODULATED FEEDBACK LOOP ANALOG-TO-DIGITAL CONVERTER

The present invention concerns a modulated feedback loop analog-to-digital converter.

The field of the invention is that of converting an analog input signal into a digital output signal in the specific case where the output signal must have a high resolution or where the input signal has a high dynamic range.

This field includes radio systems in which the input signal of a receiver can vary greatly, by an amount on the order of 100 dB or even more.

A sigma-delta type converter is one known way of converting a baseband input signal. Its main advantages are:

it has a low sensitivity to component imperfections, it is easily integrated, it has a lower power consumption than its counterparts of equal performance e.g. flash converters), it has a good linearity for high resolutions.

The sigma-delta converter is often provided with a lowpass filter function. For an input signal of bandwidth B about a center frequency $f_0$, the lowpass filter must have a cutoff frequency of at least $f_0+B/2$. Increasing the cut-off frequency is known to increase the cost of the component. Also, for a given converter sampling frequency $f_e$, the signal/noise ratio is degraded by increasing the cut-off frequency.

Substituting a bandpass filter function for the lowpass filter function is one way of improving this situation. This solution is described in "Interpolative Bandpass A/D Conversion" by J. H. DRESSLER, Signal Processing, Elsevier Science Publishers B. V., 22, pp. 139–151, 1991.

The center frequency of the bandpass filter is usually the center frequency $f_0$ of the input signal bandwidth. This produces an attenuation of $\sin x/x$ relative to a sigma-delta converter with a lowpass filter where x takes the value $\pi.f_0/f_e$ (see below). It follows that the higher the bandpass filter center frequency $f_0$, the greater is the attenuation. Increased attenuation naturally degrades the signal/noise ratio.

There is a solution to this problem, but to explain it is necessary first to summarize the operation of the sigma-delta converter, with reference to FIG. 1. The converter comprises a subtractor 1 which receives an input signal x(t) and a reference signal Ur(t) and computes the difference between them. It further comprises a filter 2 which receives the output signal of the subtractor 1 and produces a filtered signal. A sampler 3 which receives the filtered signal and produces samples therefrom, and a quantizer 4 which derives a digital error signal y(t) from these samples. The converter also comprises a feedback loop. This loop includes a digital-to-analog converter 5 which produces the reference signal Ur(t) from the error signal y(t). It is assumed here, for example, that the quantizer 4 produces a signal on two levels, i.e. that it amounts to a comparator.

Figure 2A:
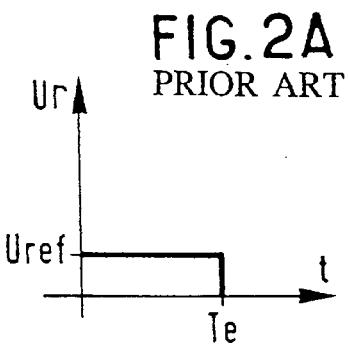
Figure 2B:
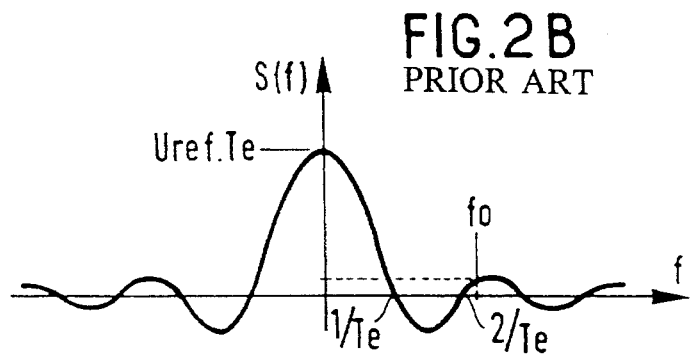

The attenuation phenomenon mentioned above is particularly marked if the sampling frequency $f_e$ is less than the center frequency $f_0$. The reference signal Ur(t) of maximal amplitude Uref can change in value at the same rate as the error signal y(t), i.e. in each sampling period Te, where Te is obviously the reciprocal of the sampling frequency $f_e$. A pulse at the output of the digital-to-analog converter 5 therefore has an amplitude Uref for a time Te, as shown in FIG. 2A. The Fourier transform S(f) of the impulse response, or frequency response, shown in FIG. 2B is of the form $\sin x/x$ already mentioned because the converter 5 incorporates a lowpass filter function. If the center frequency $f_0$ has a value of 2.25 times the sampling frequency $f_e$, for example, the attenuation is very high.

Figure 3A:
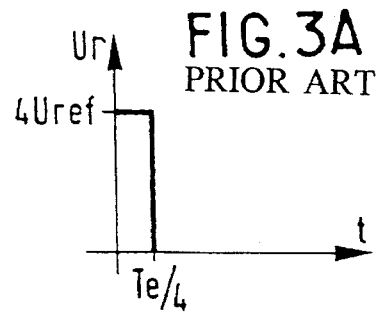
Figure 3B:
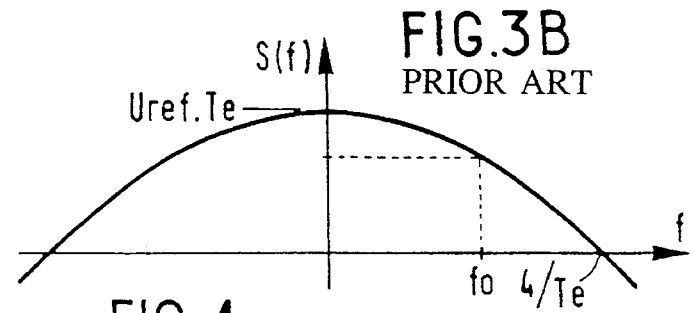

The known solution is to reduce the pulse width to approximate the ideal case of the Dirac pulse. However, the amplitude of the pulse must then be increased to maintain a constant area with the value Uref.Te. For example, the pulse duration can be divided by 4 and its amplitude multiplied by 4, as shown in FIG. 3A. The Fourier transform S(f) of the impulse response, or frequency response, is shown in FIG. 3B. The attenuation has indeed been reduced, but it is still relatively high.

Also, increasing the amplitude of the reference signal is undesirable for at least two reasons. The first is that it requires a power supply rated to allow this. This is not always possible, especially if the required increase in amplitude is great. The second reason is connected with the rise time of the digital-to-analog converter 5 and of the corresponding input stage of the subtractor 1. Although the reference signal Ur(t) in theory must have an infinite slope d(Ur)/dt, this is not the case in practise, where this slope has a fixed value k. Thus the time-delay between a change in value of the error signal y(t) and the reflection of this change in the output signal of the subtractor is proportional to the amplitude of the reference signal. The required theoretical pulse can even have an amplitude to duration ratio which is greater than this value k, so that the real pulse will never reach the required amplitude. It goes without saying that this seriously degrades the performance of the sigma-delta converter.

It is therefore clear that the solution which consists in modifying the shape of the pulse does not represent a definitive response to the problem as stated.

An object of the present invention is an analog-to-digital converter which is well suited to processing a signal occupying a frequency band B lower than its center frequency $f_0$.

The analog-to-digital converter receives an analog input signal and produces a digital error signal. It comprises a subtractor to calculate the difference between the input signal and a reference signal, a converter subsystem to produce the error signal from this difference, and a feedback loop for producing the reference signal by means of a digital-to-analog converter which supplies a comparison signal in response to the error signal. In accordance with the invention, the input signal has a center frequency, the feedback loop further comprises a displacement unit for displacing the frequency response of the digital-to-analog converter from the null frequency towards the center frequency, this displacement unit producing the reference signal from the comparison signal.

In an advantageous embodiment of the analog-to-digital converter the displacement unit is a modulator producing the reference signal by modulating the comparison signal using a modulating signal.

This represents a convenient means of achieving the required result, namely reduced attenuation and, consequently, improved performance of the analog-to-digital converter.

In accordance with a first option, the modulating signal may have a spectral component at a modulation frequency equal to the center frequency.

Also, in accordance with a simple solution, the reference signal is the product of the comparison signal and the modulating signal.

The invention naturally applies if the converter subsystem comprises a sampler operating at a sampling frequency such that the error signal has a constant value throughout a sampling period.

Accordingly, in accordance with a second option, the modulating signal has a spectral component at a modulation frequency equal to a multiple of half the sampling frequency.

The modulating signal has a positive value at the end of each sampling period.

The converter subsystem further comprises a bandpass filter centered on the center frequency and a quantizer.

This quantizer is advantageously a comparator.

In addition, a lowpass filter can be added between the digital-to-analog converter and the displacement unit.

Figure 4:
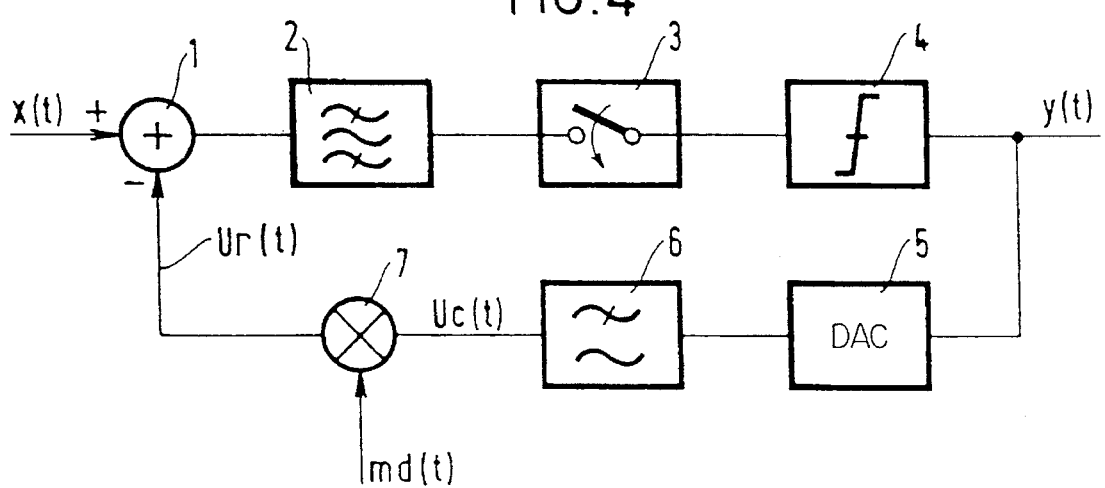
Figure 5:
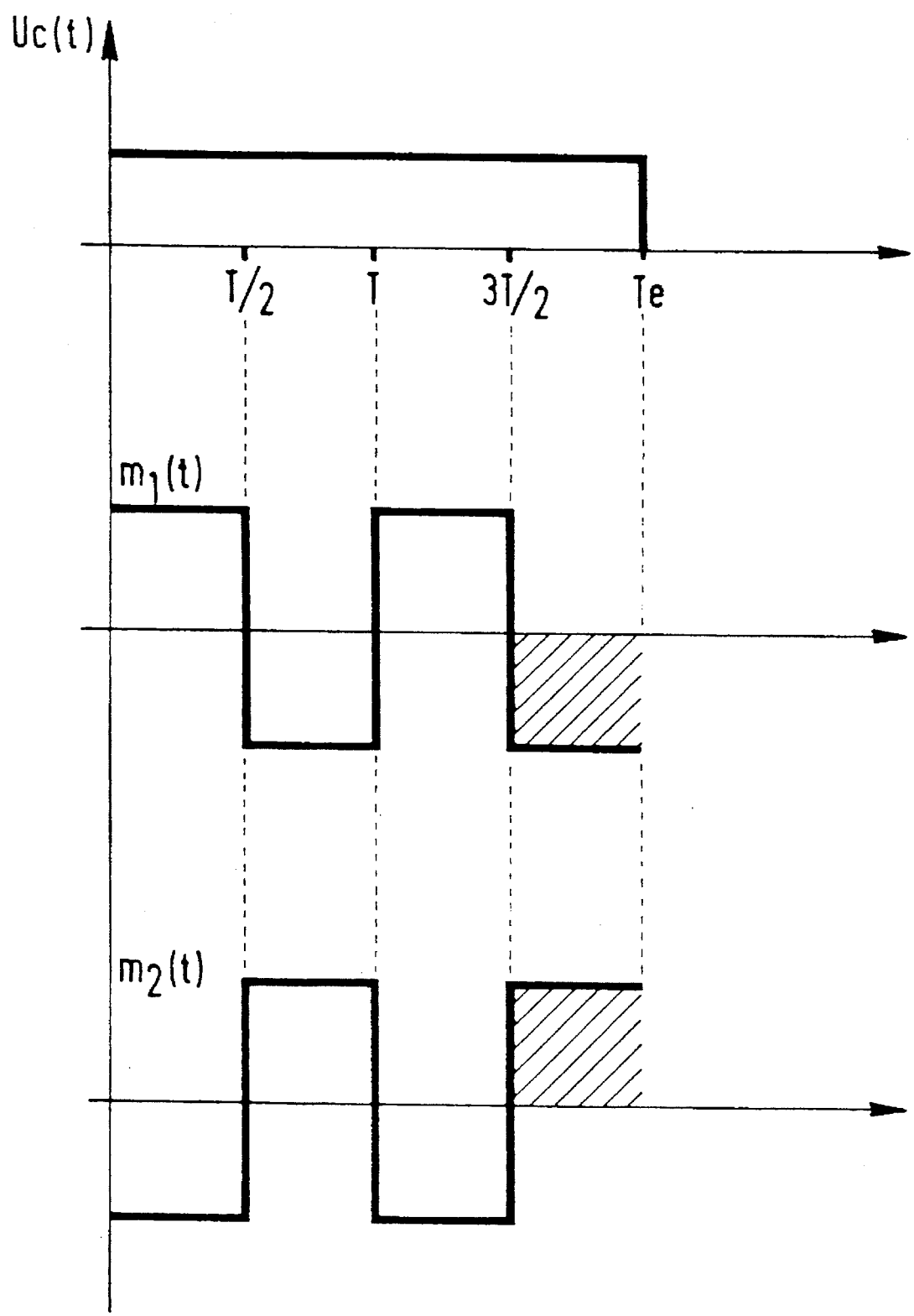
Figure 6:
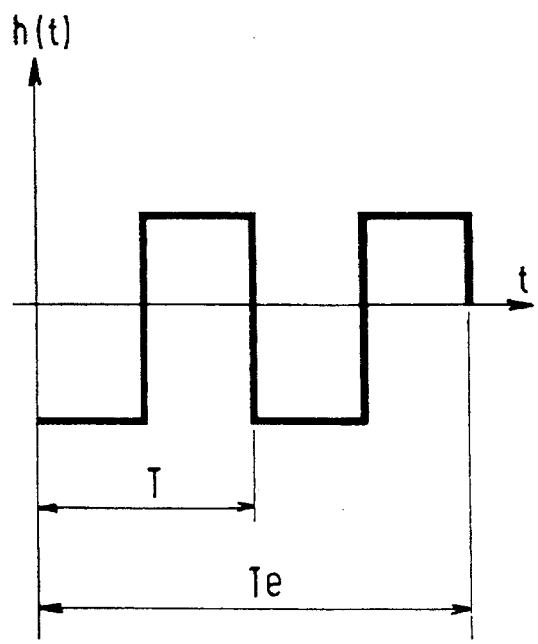
Figure 6:
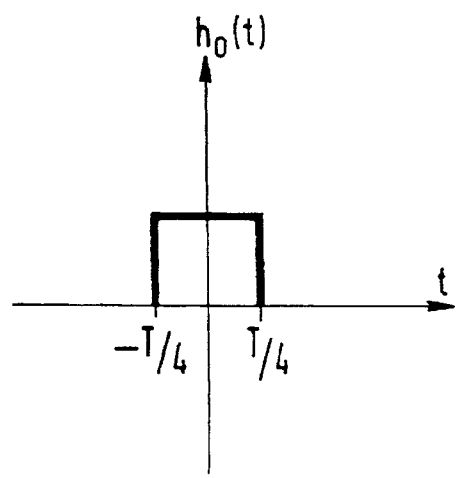
Figure 6:
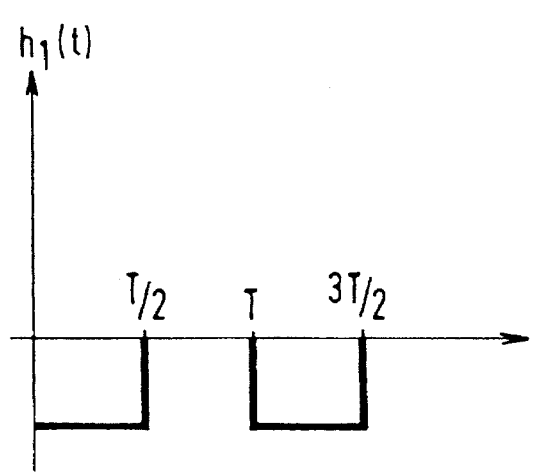
Figure 6:
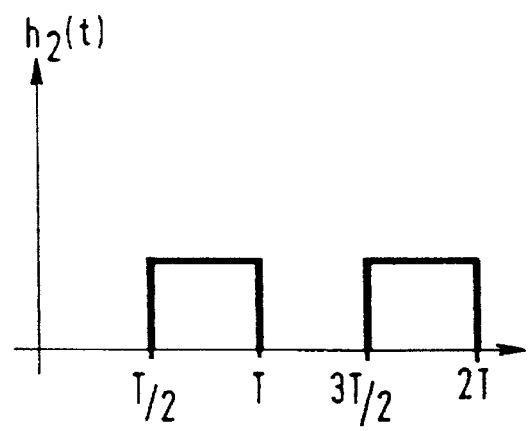
Figure 7:
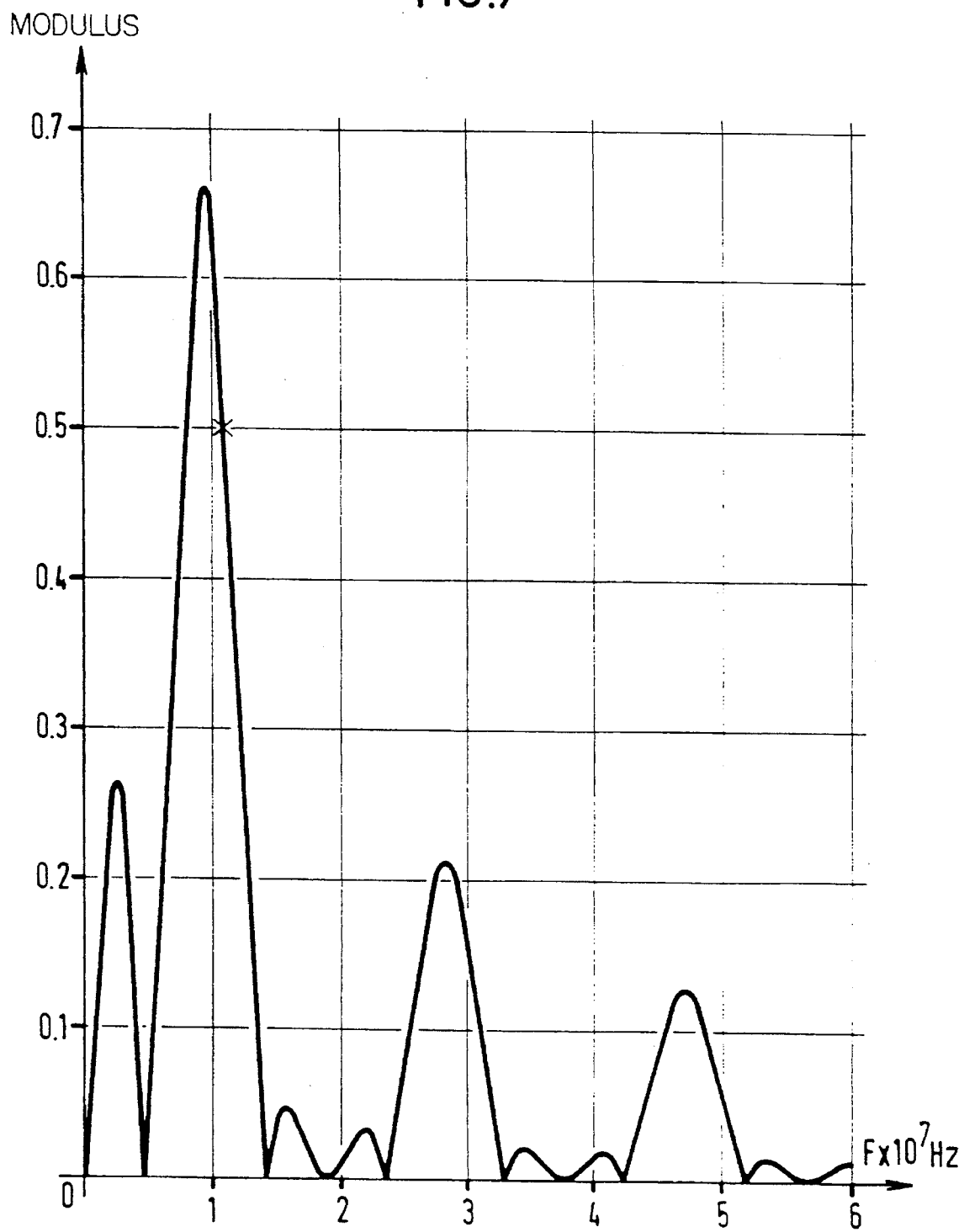
Figure 8:
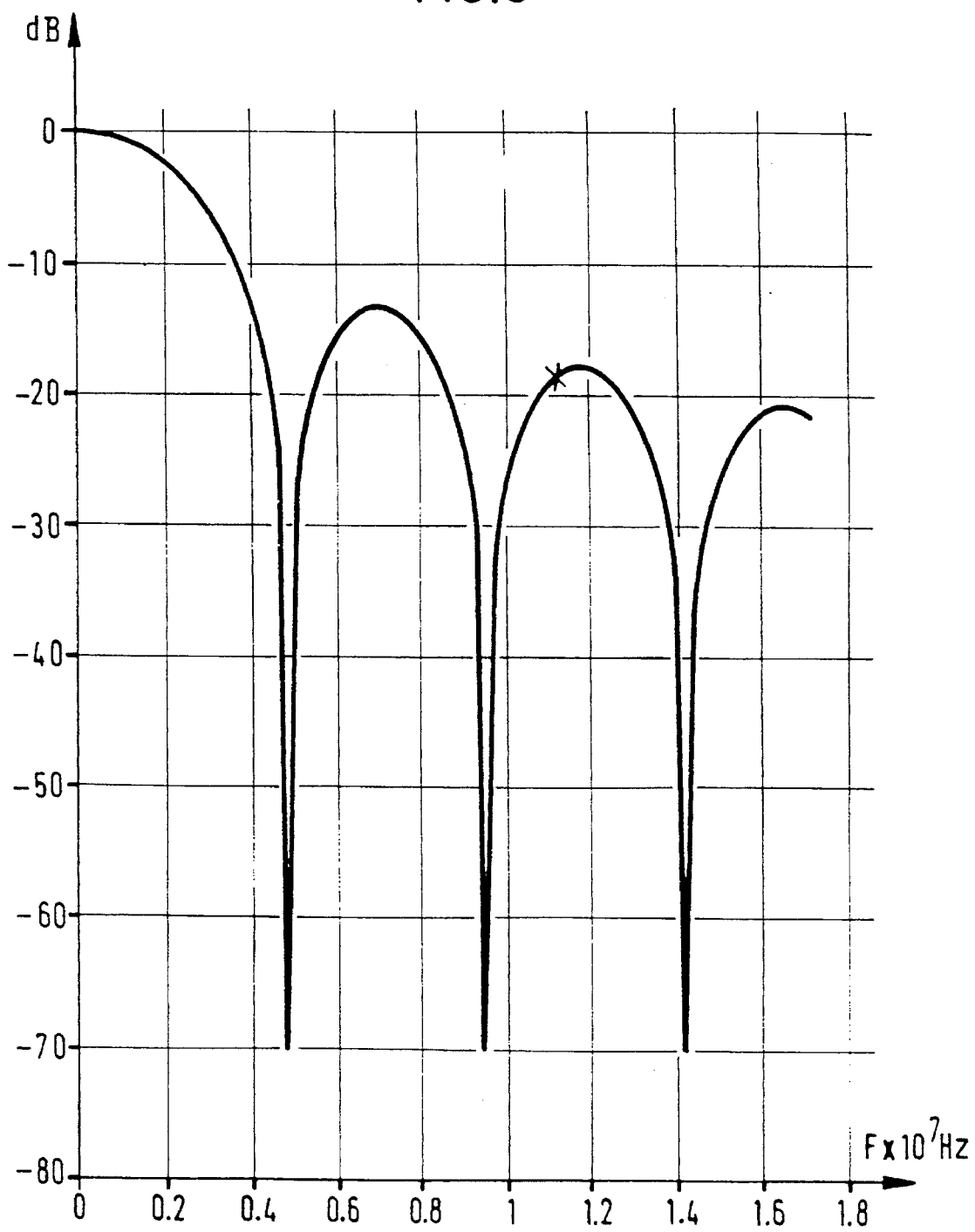

The invention will emerge more clearly from the following description given with reference to the appended figures in which:

FIG. 1 shows a prior art analog-to-digital converter,

FIGS. 2A and 2B respectively show a calibrated pulse and the Fourier transform of the impulse response of a first prior art converter, FIGS. 3A and 3B respectively show a calibrated pulse and the Fourier transform of the impulse response of a second prior art converter, FIG. 4 shows one embodiment of an analog-to-digital converter in accordance with the invention, FIG. 5 shows the comparison signal and the modulating signal used in this converter, FIG. 6 is a diagram showing the impulse response of the feedback loop of this converter, FIG. 7 is a diagram showing the modulus of the transfer function of this loop, FIG. 8 is a diagram showing the modulus of the transfer function of a part of this loop.

Components present in more than one figure always carry the same reference number.

Sigma-delta converters usually have two main functions: conversion proper and a digital processing function including filtering and decimation. The invention is concerned with conversion proper, i.e. with the means for obtaining the error signal at the quantizer output. From now on, although it represents a strained interpretation of the terminology, these means only are referred to as the analog-to-digital converter.

The invention proposes to alleviate the attenuation phenomenon described above and shown diagrammatically in FIG. 2B.

To this end, the main lobe of the frequency response which is the Fourier transform S(f) of the impulse response is displaced from the frequency f=0 towards the center frequency $f_0$ by means of a displacement unit.

Referring to FIG. 4, in the known way the sigma-delta converter comprises a subtractor which receives an input signal x(t) and a reference signal Ur(t) and computes the difference between them. The converter further comprises a bandpass filter 2 which receives the output signal of the subtractor 1 and produces a filtered signal, a sampler 3 which receives this filtered signal and produces samples therefrom, and a quantizer 4 which derives a digital error signal y(t) from the samples. It is assumed here, by way of example, that the quantizer 4 produces a signal on two levels, i.e. that it amounts to a comparator. The combination of the filter 2, the sampler 3 and the quantizer 4 implements a function familiar to the person skilled in the art and is referred to herein as the converter subsystem.

The sigma-delta converter also comprises a feedback loop. This loop includes a digital-to-analog converter 5 which produces a comparison signal Uc(t) from the error signal y(t).

In accordance with the invention, the feedback loop comprises the displacement unit which produces the reference signal Ur(t) from the comparison signal Uc(t).

A lowpass filter 6 is optionally provided at the output of the digital-to-analog converter 5. The function of this filter is explained below.

One embodiment of the displacement unit is described next: it comprises a modulator (7) which produces the reference signal Ur(t) by modulating the (optionally filtered) comparison signal Uc(t) by means of a modulating signal md(t).

In the present example, the modulation operation is a multiplication with the result that the reference signal Ur(t) takes the value of the product of the comparison signal Uc(t) and the modulating signal md(t).

The object of this modulation is to modify the frequency response of the digital-to-analog converter 5.

The modulating signal md(t) can be a sinusoidal signal, in which case the lowpass filter 6 is of less benefit. However, it can be more convenient to choose a squarewave signal in order to facilitate the implementation of the modulator 7, for example.

In this latter case, the modulator 7 displaces towards the frequency of the modulating signal md(t), referred to as modulating frequency $f_m$:

the main lobe of S(f) (because of the effect of the fundamental component of the modulating signal), secondary lobes (because of the product of the harmonics of the modulating signal and secondary lobes of S(f)).

These secondary lobes can be regarded as noise. This is where the full benefit of the lowpass filter 6 is obtained, by eliminating this unwanted noise.

The modulating signal md(t) is therefore chosen to have a spectral component at the modulation frequency $f_m$ near the center frequency $f_0$. In the ideal case these two frequencies would be equal, but it may be more convenient to adopt different values, if only for technical reasons.

Given that a clock generator is already present to produce the sampling frequency $f_e$, an advantageous solution is to choose the modulation frequency $f_m$ as a multiple of half the sampling frequency:

$f_m = m.f_e/2$ where m is an integer, $T=1/f_m$.

The phase of md(t) is important for the stability of the sigma-delta converter. However, the ambiguity of the phase for the cases where m>0 is simple to resolve, as described by J. H. DRESSLER in the reference work already mentioned. The signal md(t) is deemed to be synchronous with the sampling frequency fe. There are two cases to consider, as shown in FIG. 5, in which m=4 by way of example.

The figure shows the comparison signal Uc(t) and two possible forms of the modulating signal:

in the first form $m_1(t)$, this signal is in phase with the comparison signal, in the second form $m_2(t)$, this signal is 180 degrees out of phase with the comparison signal.

With the first form of the modulating signal $m_1(t)$, there is positive feedback at the end of the sampling period, i.e. between 3T/2 and Te in the present case. This phenomenon can cause oscillation of the sigma-delta converter. An advantageous solution is to choose the second form $m_2(t)$ of the modulating signal to avoid any risk of instability. What is important is that the modulating signal always has a positive value at the end of a sampling period, i.e. at the time of a possible change of value of the comparison signal Uc(t).

The known expression for the transfer function G(p) of a second order lowpass filter is:

$$G(p) = a_0 \cdot \left[ \frac{1}{p} + \frac{\alpha}{p^2} \right]$$

This lowpass filter can be converted into the bandpass filter 2 of the sigma-delta converter by means of a transformation X(p) such as, for example:

$$X(p) = \frac{B \cdot p}{p^2 + B \cdot p + \omega_0^2}$$

where B represents the bandwidth and $\omega_0$ the center angular frequency.

The expression for the corresponding fourth order bandpass filter F(p) is thus:

$$F(p) = a_0 \cdot \frac{Bp(p^2 + (1+\alpha)Bp + \omega_0^2)}{(p^2 + Bp + \omega_0^2)^2} \quad (1)$$

The coefficient $\alpha$ and the gain $a_0$ are determined to optimize noise rejection while guaranteeing stability of the sigma-delta converter.

Also, the product of the digital-to-analog converter 5 and the modulator has an impulse response h(t).

The following notation is used in FIG. 6:

$h_0(t)$ is an elementary signal which corresponds to a pulse of duration T/2 centered at the time origin, $h_1(t)$ is a first combination signal which corresponds to the negative pulses of h(t), and $h_2(t)$ is a second combination signal which corresponds to the positive pulses of h(t).

By convention, $H(\omega)$, $H_0(\omega)$, $H_1(\omega)$, $H_2(\omega)$ represent the Fourier transforms of the respective functions
$h(t)$, $h_0(t)$, $h_1(t)$, $h_2(t)$.

We can therefore write:

$$N = Te/T = m/2 \quad (2)$$
$$h(t) = h_1(t) + h_2(t)$$
$$H_1(\omega) = -H_0(\omega) \cdot (e^{\frac{-j\omega T}{4}} + e^{\frac{-5j\omega T}{4}} + e^{\frac{-9j\omega T}{4}} + \dots)$$
$$H_1(\omega) = -H_0(\omega) \cdot \sum_{n=0}^{N-1} e^{\frac{-j\omega(4n+1)T}{4}}$$
$$H_2(\omega) = +H_0(\omega) \cdot (e^{\frac{-3j\omega T}{4}} + e^{\frac{-7j\omega T}{4}} + e^{\frac{-11j\omega T}{4}} + \dots)$$
$$H_2(\omega) = +H_0(\omega) \cdot \sum_{n=0}^{N-1} e^{\frac{-j\omega(4n+3)T}{4}}$$
$$H(\omega) = H_1(\omega) + H_2(\omega)$$
$$H(\omega) = +H_0(\omega) \cdot \sum_{n=0}^{2N-1} (-1)^{(n+1)} e^{\frac{-j\omega(2n+1)T}{4}}$$

whence, $$H_0(\omega) = \frac{T}{2} \cdot \frac{\sin \frac{\omega T}{4}}{\frac{\omega T}{4}}$$

The following constitutes one numerical example:

| Bandwidth | B | 20 kHz |
|---|---|---|
| Center frequency | $f_0$ | 10.6 MHz |
| Sampling frequency | $f_e$ | 4.71 MHz |
| Modulating signal frequency | $f_m$ | 9.42 MHz |
| Ratio $f_m/(f_e/2)$ | m | 4 |
| Bandpass filter order | R | 2 |
| Reference signal amplitude | Uref | 1 V |

The expression for the bandpass filter F(p) was determined using equation (1). This expression is obtained by taking $a_0=1$ and $\alpha=0.5$.

The transfer function of the combination of the digital-to-analog converter 5 and the modulator 7 is expressed as follows, according to equation (2):

$$H(\omega) = +H_0(\omega) \cdot \sum_{n=0}^{3} (-1)^{(n+1)} e^{\frac{-j\omega(2n+1)T}{4}}$$

FIG. 7 shows the modulus of $H(\omega)$. FIG. 8 shows the modulus of the transfer function of the digital-to-analog converter 5. The converter of the invention thus produces an attenuation of 6 dB rather than an attenuation of around 20 dB in the absence of a modulator.

We claim:

1. Analog-to-digital converter receiving an analog input signal having a center frequency to produce a digital error signal, said converter comprising a subtractor to calculate a difference between said input signal and a reference signal;

a converter subsystem to produce said error signal from said difference, and a feedback loop to produce said reference signal, said loop comprising a digital-to-analog converter which delivers a comparison signal in response to said error signal, a displacement means for displacing the frequency response of said digital-to-analog converter from the null frequency towards said center frequency, said displacement means producing said reference signal from said comparison signal.

2. Analog-to-digital converter according to claim 1 wherein said displacement means comprises a modulator producing said reference signal by modulating said comparison signal with a modulating signal.

3. Analog-to-digital converter according to claim 2 wherein said modulating signal has a spectral component at a modulation frequency substantially equal to said center frequency.

4. Analog-to-digital converter according to claim 2 wherein said reference signal is the product of said comparison signal and said modulating signal.

5. Analog-to-digital converter according to claim 4 wherein said converter subsystem further comprises a sampler operating at a sampling frequency whereby said error signal retains a constant value during a sampling period.

6. Analog-to-digital converter according to claim 5 wherein said modulating signal has a spectral component at a modulation frequency substantially equal to a multiple of half said sampling frequency.

7. Analog-to-digital converter according to claim 5 wherein said modulating signal has a positive value at the end of each sampling period.

8. Analog-to-digital converter according to claim 5 wherein said converter subsystem comprises a bandpass filter substantially centered on said center frequency.

9. Analog-to-digital converter according to claim 5 wherein said converter subsystem further comprises a quantizer.

10. Analog-to-digital converter according to claim 9 wherein said quantizer comprises a comparator.

11. Analog-to-digital converter according to claim 1 further comprising a lowpass filter between said digital-to-analog converters and said displacement means.

* * * * *